United States Patent
Li et al.

(10) Patent No.: US 7,876,670 B2
(45) Date of Patent: Jan. 25, 2011

(54) METHOD FOR TRANSMITTING DATA, METHOD FOR RECEIVING DATA, TRANSMITTER, RECEIVER, AND COMPUTER PROGRAM PRODUCTS

(75) Inventors: Yuan Li, Singapore (SG); Sumei Sun, Singapore (SG); Yan Wu, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 268 days.

(21) Appl. No.: 11/815,381

(22) PCT Filed: Feb. 2, 2006

(86) PCT No.: PCT/SG2006/000019

§ 371 (c)(1),
(2), (4) Date: May 21, 2008

(87) PCT Pub. No.: WO2006/083233

PCT Pub. Date: Aug. 10, 2006

(65) Prior Publication Data

US 2009/0180495 A1    Jul. 16, 2009

(51) Int. Cl.
*H04J 11/00*    (2006.01)
(52) U.S. Cl. .................. 370/206; 375/298; 375/320
(58) Field of Classification Search .......... 370/204, 370/206, 207, 328, 338; 375/298, 320
See application file for complete search history.

(56) References Cited

U.S. PATENT DOCUMENTS

| | | | |
|---|---|---|---|
| 4,975,952 A * | 12/1990 | Mabey et al. ............... | 713/160 |
| 5,623,505 A * | 4/1997 | Funamoto et al. ........... | 714/769 |
| 5,889,783 A * | 3/1999 | Maloney et al. ............ | 714/701 |
| 6,031,874 A * | 2/2000 | Chennakeshu et al. ...... | 375/262 |
| 7,120,849 B2 * | 10/2006 | Hwang et al. ............... | 714/752 |
| 2004/0001555 A1 | 1/2004 | Taffin et al. ................ | 375/261 |
| 2004/0171359 A1 * | 9/2004 | Tirkkonen et al. ......... | 455/127.1 |

(Continued)

FOREIGN PATENT DOCUMENTS

JP    2002064470    2/2002

OTHER PUBLICATIONS

Eleftheriou E. et al., "Accepted from Open Call-Application of Capacity-Approaching Coding Techniques to Digital Subscriber Lines," IEEE Communications Magazine, IEEE Service Center, Piscataway, US, vol. 42, No. 4, Apr. 2004 pp. 88-94.

(Continued)

*Primary Examiner*—Ricky Ngo
*Assistant Examiner*—Christine Ng
(74) *Attorney, Agent, or Firm*—Paul J. Backofen, Esq.; Crockett & Crockett, PC

(57) ABSTRACT

A method for transmitting data comprising a plurality of bits is described wherein the data is mapped to a plurality of modulation symbols, each modulation symbol comprising at least one more significant bit and at least one less significant bit, at least one parity bit is generated for the plurality of bits and the plurality of bits are mapped to more significant bits of the plurality of modulation symbols and the at least one parity bit is mapped to at least one less significant bit of the plurality of modulation symbols.

7 Claims, 4 Drawing Sheets

U.S. PATENT DOCUMENTS

2005/0010853 A1  1/2005  Duvant et al. ............... 714/792
2006/0036924 A1* 2/2006  Ghosh ....................... 714/755

OTHER PUBLICATIONS

J. Hou, P. H. Siegel, L. B. Milstein, and H. D. Pfister, *Capacity-approaching bandwidth-efficient coded modulation schemes based on low-density parity-check codes*, IEEE Trans. Inform. Theory, vol. 49, No. 9, pp. 2141-2155, Sep. 2003.

IEEE 802.11a *Wireless LAN medium access control and physical layer specifications: high-speed physical layer in the 5GHz band*, IEEE std 802.11a-1999, Sep. 1999.

A. H. S. Mohammadi, A. K. Khandani, *On unequal error protection on turbo-encoder output bits*, Electronics Letters, vol. 33, No. 4, pp. 273-274, Feb. 1997.

V. Kumar, O. Milenkovic, *On unequal error protection 20 LDPC codes based on Plotkin-type Construction*, IEEE GlobeCom 2004, Dallas, TX, Nov. 2004.

X. Tang, M.-S. Alouini, A. J. Goldsmith, *Effect of channel estimation error on M-QAM BER performance in Rayleigh 25 fading*, IEEE Trans. Commun., vol. 47, No. 12, pp. 1856-1864, Dec. 1999.

Jinhong Yuan, et al., *Turbo Trellis Coded Modulation for Fading Channels*, Proc. of IEEE, Vehicular Technology Conference, VTC 2000 Spring, Tokyo, Japan, pp. 2059-2063, May 2000.

* cited by examiner

METHOD FOR TRANSMITTING DATA, METHOD FOR RECEIVING DATA, TRANSMITTER, RECEIVER, AND COMPUTER PROGRAM PRODUCTS

FIELD OF THE INVENTION

The invention relates to a method for transmitting data, a method for receiving data, a transmitter, a receiver, and computer program products.

BACKGROUND OF THE INVENTION

In communication systems, methods for detecting and correcting errors that occur during transmission are used to increase reliability. One possibility is to use Low-density parity-check (LDPC) code which is described in [1] and is a capacity-approaching coding scheme which has attracted a lot of attention nowadays. Compared with turbo code, which is also a capacity-approaching code, LDPC code has better performance in case of a large block size even though the decoding complexity is less that that of turbo code.

Another commercial advantage of LDPC is that the LDPC patents have expired, so companies can use LDPC without having to pay for intellectual property rights.

The usage of an LDPC encoder together with an M-ary modulator, termed as LDPC coded modulation, is described in [2] and provides for high power and bandwidth efficiency. The M-ary modulator maps every $\log_2 M$ LDPC encoded bits to a constellation symbol, for example according to Gray mapping. This mapping does not introduce any latency in transmission, which is different from bit interleaving in bit-interleaved coded modulation (BICM). By optimal design of LDPC code, LDPC coded modulation can get close to the capacity limit of coded modulation.

The LDPC code and LDPC coded modulation have been widely introduced into next-generation wireless communication systems for reliable and efficient transmission at high data rates. LDPC in combination with quadrature amplitude modulation (QAM) and MIMO-OFDM (multiple input multiple output-orthogonal frequency division multiplexing) has been shown to be superior over turbo code in high-throughput (HT) wireless local access networks (WLANs). It is also a competitive candidate in the optional HT-mode in proposals for the IEEE 802.11n standard. LDPC code has also been proposed for IEEE 802.16, standard for Broadband Wireless Access (BWA), which also requires higher-order modulation. There are also a lot of proposals on the design of LDPC into the ultra-wideband (UWB) wireless communications, where there is possibility that LDPC is used in a QAM UWB system.

In the conventional bit-interleaved coded modulation (BICM) schemes applying convolutional code or turbo code, a bit interleaver between the encoder and modulator is necessary in order to permute coded bits to different positions in different symbols.

In IEEE 802.11a standard, the bit interleaver processes two steps of permutation by Step 1:
Mapping adjacent coded bits onto nonadjacent modulated symbols to avoid burst errors introduced by single symbol and channel correlation.

When N denotes the codeword size, the first permutation is defined as $$i = (N/d)(k \bmod d) + \text{floor}(k/d), \ k=0,1,K,N-1, \quad (1)$$

where d is the interleaving depth, and floor(•) denotes the largest integer not exceeding the parameter.

Step 2:
Mapping adjacent coded bits alternately onto more significant bits (MSBs) and less significant bits (LSBs) of the constellation to avoid long runs of LSBs with low reliability.

The second permutation is defined as $$j = s \times \text{floor}(i/s) + (i + N - \text{floor}(d \times i/N)) \bmod s, \ i=0,1,K,N-1 \quad (2)$$

where $$s = \max\left(\frac{\log_2 M}{2}, 1\right)$$

is determined by the modulation order M.

Two methods for use with LDPC coded modulation are described in the following.

The first method is to use the bit interleaver according to IEEE 802.11a as described above to permute the LDPC encoded bits, cf. [2].

The second method is the direct mapping of a LDPC codeword into an M-ary symbol. This is explained in the following.

An (N, K) LDPC code is given by its parity-check matrix, $H=[\underline{H}_1 \ \underline{H}_2]$, where K and N are the numbers of information bits (to be coded) and the number of LDPC coded bits, respectively. The generator matrix is given by $$\underline{G}[\underline{IH}_1{}^T\underline{H}_2{}^{-T}] \quad (3)$$

where $\underline{I}_{k \times k}$ is the identity matrix generating systematic bits of the codeword. The codeword based on $\underline{G}$ is $$\underline{c}=\underline{u}\underline{G}=[\underline{u}\underline{u}\underline{H}_1{}^T\underline{H}_2{}^{-T}]=[\underline{u}\underline{p}], \quad (4)$$

where $\underline{u}$ is the information sequence (vector of user data bits). The codeword $\underline{c}$ consists of the vector of systematic bits $\underline{u}$ and the vector of parity bits $\underline{p}$.

According to the second method, consecutive $\log_2 M$ bits from codeword $\underline{c}$ are directly mapped into an M-ary constellation symbol.

The usage of the first method, i.e. using a bit interleaver, is not optimal since in contrast to conventional BICM, a bit interleaver is not required in LDPC coded modulation. This is the advantage of LDPC coded modulation over conventional coded modulation.

Further, the first method has the disadvantage that it is not optimal to apply the permutation rule used in IEEE 802.11a for LDPC coded modulation. This is because the second permutation according to equation (2) maps adjacent coded bits to more significant bits (MSBs) and less significant bits (LSBS) alternately in phase shift keying (PSK) and QAM, which is only suitable for non-systematic codes such as convolutional code that is used in according to IEEE 802.11a (see [3]).

The second method has a similar drawback. While consecutive coded bits from codeword $\underline{c}$ are mapped directly into PSK or QAM symbols, the systematic bits and parity bits are placed into MSBs and LSBs evenly.

In [4] the result of a study is given that shows that turbo code performs better when systematic and parity-check bits are assigned different power levels than when equal power is assigned to the whole codeword. For large block size, better performance is achieved when the systematic bits are protected better than the parity check bits and this effect becomes stronger as the block size increases. Research on unequal error protection in LDPC code mainly focuses on the construction of the LDPC codeword (cf. [5], [6]). It has been found out that in general the larger the variable node degrees, the higher the average radiabilities after decoding. This conclusion is only applicable to irregular LDPC code, however.

An object of the invention is to increase performance of LDPC coded modulation methods.

The object is achieved by the method of transmitting data, the method for receiving data, the transmitter, the receiver, and the computer program products with the features according to the independent claims.

SUMMARY OF THE INVENTION

A method for transmitting data comprising a plurality of bits is provided wherein the data is mapped to a plurality of modulation symbols, each modulation symbol comprising at least one more significant bit and at least one less significant bit, at least one parity bit is generated for the plurality of bits and the plurality of bits are mapped to more significant bits of the plurality of modulation symbols and the parity bits are mapped to less significant bits of the plurality of modulation symbols.

Further, a transmitter and a computer program product according to the method for transmitting data described above are provided.

Further, a method for receiving data comprising a plurality of bits is provided wherein a plurality of modulation symbols are received, each modulation symbol comprising at least one more significant bit and at least one less significant bit, at least one parity bit for the plurality of bits is extracted from at least one less significant bit of the plurality of modulation symbols and the plurality of bits are extracted from the plurality of modulation symbols.

Further, a receiver and a computer program product according to the method for receiving data described above are provided.

DETAILED DESCRIPTION

Figure 1:
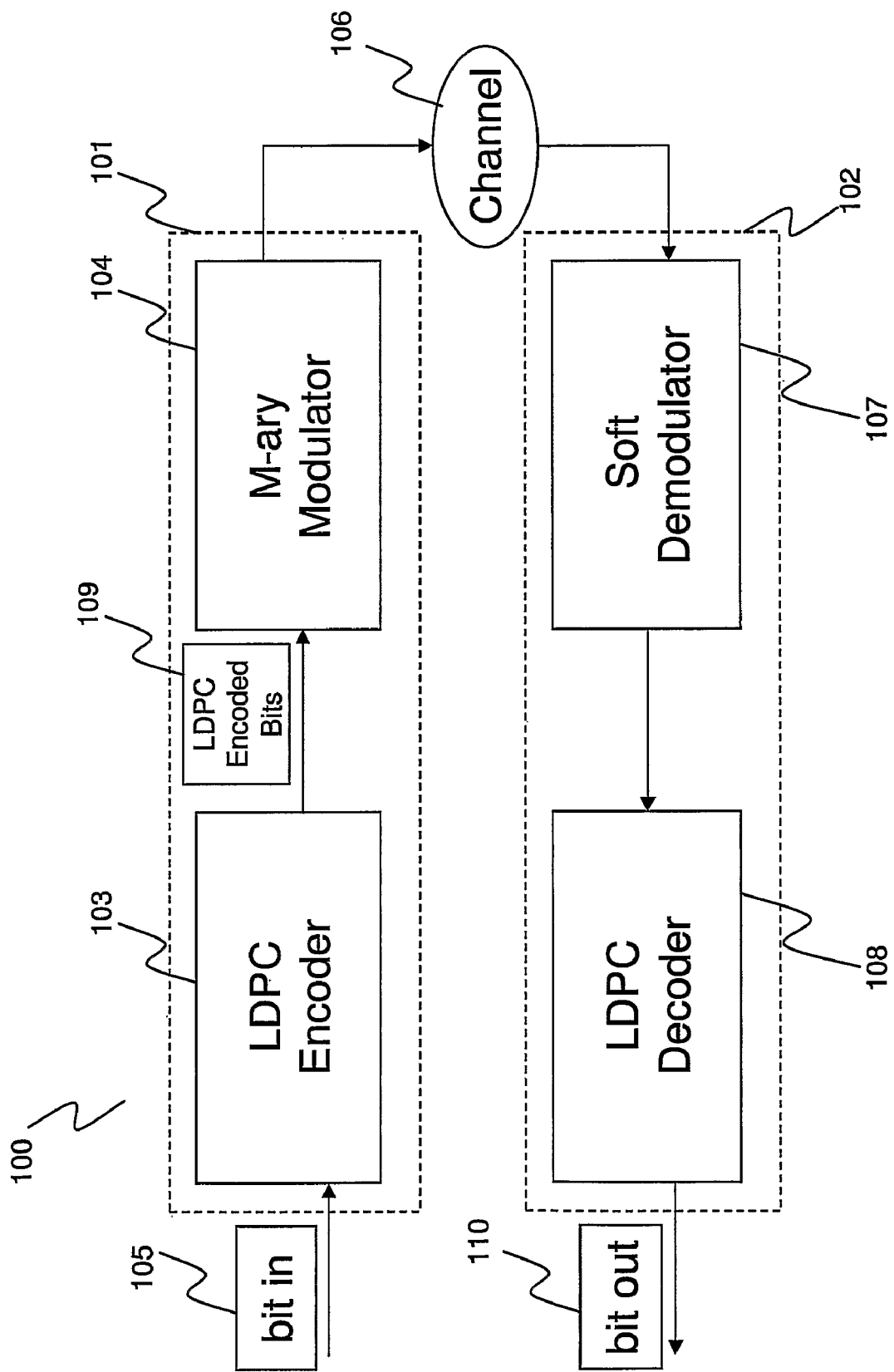
FIG. 1 shows a communication system according to an embodiment of the invention.

Illustratively, the data bits (the systematic bits in case of LDPC (Low-density parity-check) coding) are mapped to more significant bits (MSBs) of the modulation symbols, while the parity bits are mapped to the less significant bits (LSBs) of the modulation symbols.

As will be shown below, this kind of unequal error protection (UEP) scheme outperforms conventional methods, in particular when it is applied to LDPC PSK or QAM (quadrature amplitude modulation). The performance gain is comparable to and sometimes even more significant than the gain introduced by increasing the frame size of LDPC which, in contrast to the usage of invention, increases the complexity and memory cost of both encoder and decoder.

No transmission rate is sacrificed by using the invention and no extra latency and extra processing burden to the transmitter and receiver as compared to the two prior art methods described above (Method 1: using bit interleaver according to IEEE 802.11a; Method 2: direct mapping of LDPC codeword to M-ary symbol) are introduced. The ordering of the plurality of data bits and the parity bits such that the data bits are mapped to MSBs and the parity bits are mapped to LSBs may be pre-designed and may be embedded in the generation of generation matrices and parity-check matrices as is shown below for LDPC.

Embodiments of the invention emerge from the dependent claims. The embodiments which are described in the context of the method for transmitting data are analogously valid for the transmitter, the method for receiving data, the receiver and the computer program products.

The plurality of modulation symbols may be sent using at least one communication channel. In particular, the invention is applicable to MIMO (multiple input multiple output) systems, for example MIMO OFDM (orthogonal frequency division multiplexing) systems.

For example, at least one carrier signal is modulated according to the plurality of modulation symbols.

In one embodiment, the at least one parity bit is generated according to an LDPC encoding of the plurality of bits.

The data may be mapped to the plurality of modulation symbols according to a quadrature amplitude modulation, for example 16QAM or 64QAM using Gray mapping. The invention can in particular be applied to all communication systems using LDPC coded QAM modulation. The invention can also be applied when phase shift keying (PSK) is used, for example 8PSK, 16PSK and so on, and other modulation schemes when there exists more significant bits and less significant bits.

The invention may be seen based on the fact that it has been found out that even if LDPC code has equal variable node degrees, it provides better performance when systematic bits are highly protected as compared with the cases when parity-check bits are highly protected or when systematic and parity-check bits are equally protected.

In an M-ary modulation system, bits assigned to MSBs have better bit-error rate (BER) performance than those assigned to LSBs, or equivalently, bits in MSBs experience higher SNR than those in LSBs.

Illustrative embodiments of the invention are explained below with reference to the drawings.

FIG. 1 shows a communication system 100 according to an embodiment of the invention.

The communication system 100 comprises a transmitter 101 and a receiver 102.

The transmitter 101 comprises an LDPC encoder 103 and an M-ary modulator 104. Data to be sent by the transmitter 101 to the receiver 102 via a communication channel 106 is supplied to the LDPC encoder 103 in form of a first bit stream 105. The LDPC encoder 103 performs LDPC encoding on the first bit stream 105 to generate an LDPC encoded bit stream 109. The LDPC encoded bits of the LDPC encoded bit stream 109 are grouped into code words of length N and are mapped into M-ary constellation symbols by the M-ary modulator 104. Gray mapping is applied in this embodiment because it is superior over anti-Gray mapping, set partitioning mapping etc.

The constellation symbols are transmitted to the receiver via the communication channel 106.

The receiver 102 comprises a soft demodulator 107 which generates a bit metric for each transmitted bit based on maximum likelihood criterion and the soft bit metric values generated in this way are supplied to an iterative LDPC decoder 108. The LDPC decoder 108 applies the sum-product message-passing algorithm to generate the received data in the form of a second bit stream 110.

The LDPC encoding of the first bit stream 105 and the mapping of the LDPC encoded bit stream 109 to constellation symbols are explained in the following in more detail.

The LDPC encoder 103 maps every K bits of the first bit stream 105 to a codeword $\underline{c}$ of length N. This means that the LDPC encoder 103 implements an (N, K) LDPC code. The LDPC code is given by its parity-check matrix, $H=[\underline{H}_1\ \underline{H}_2]$. The generator matrix is given by $$\underline{G}=[\underline{I}\underline{H}_1{}^T\underline{H}_2{}^{-T}] \quad (5)$$

where $\underline{I}_{k \times k}$ is the identity matrix generating systematic bits of the codeword. The codeword $\underline{c}$ based on $\underline{G}$ is given by $$\underline{c}=\underline{u}\underline{G}=[\underline{u}\underline{u}\underline{H}_1{}^T\underline{H}_2{}^{-T}]=[\underline{u}\underline{p}] \quad (6)$$

where $\underline{u}$ is the vector of K bits mapped to the codeword $\underline{c}$, also denoted as the vector of systematic bits. The codeword $\underline{c}$ consists of the vector of systematic bits $\underline{u}$ and the vector $\underline{p}$, which is called the vector of parity bits.

The codeword c, which is a part of the LDPC encoded bit stream 109, is mapped to $$\frac{N}{\log_2 M}$$

constellation symbols. This mapping corresponds to an arrangement in form of a block of bits, which is shown in the FIG. 2.

Figure 2:
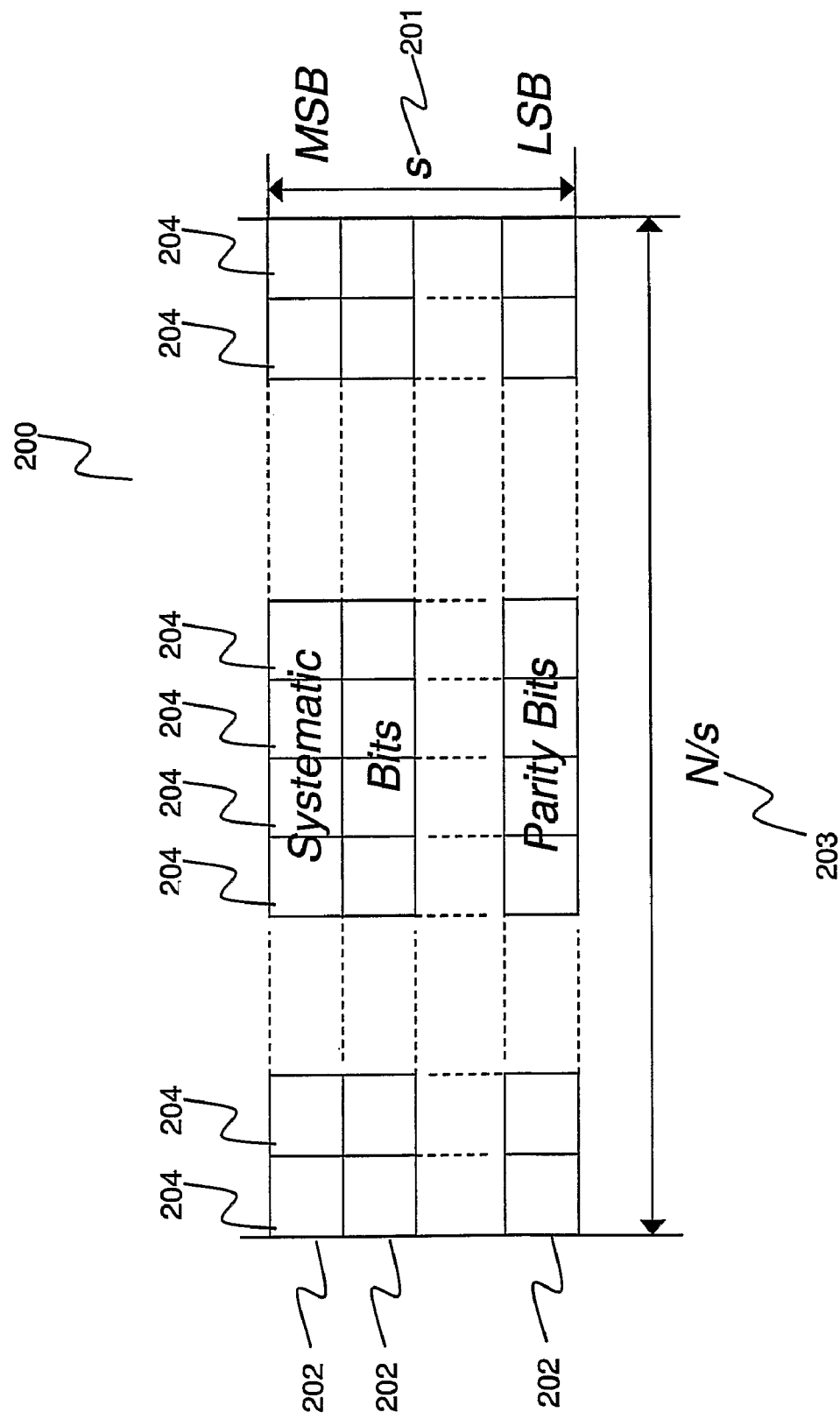
FIG. 2 shows a block of bits corresponding to a modulation according to an embodiment of the invention.

FIG. 2 shows a block 200 of bits corresponding to a modulation according to an embodiment of the invention.

The height 201 of the block 200, i.e. the number of rows 202 of the block 200 is $$s = \max\left(\frac{\log_2 M}{2}, 1\right).$$

M is the modulation order, for example M=8 for 8PSK, M=16 for 16QAM and M=64 for 64QAM.

The width 203 of the block 200, i.e. the number of columns 204 of the block 200 is N/s. This means that the block 200 comprises N bits. Therefore, the block 200 can exactly hold the bits of the codeword $\underline{c}$.

Every odd column of the block 200, i.e. the first column, the third column, etc., corresponds to an I (in phase) component. Every even column of the block 200, i.e. the second column, the fourth column, etc., corresponds to a Q (quadrature) component. Every two columns of the block 200 are mapped to a constellation symbol. For example, the first column and the second column of the block 200 are mapped to a constellation symbol, wherein the first column specifies the I component and the second column specifies the Q component.

In another embodiment, each column of the first half of the columns of the block 200, i.e., the first column, the second column, and so on to the $$\left(\frac{1}{2}\cdot\frac{N}{s}\right)th$$

column, corresponds to an I (in phase) component. Each of the columns of the second half of the columns of the block 200, i.e. the $$\left(\frac{1}{2}\cdot\frac{N}{s}+1\right)th$$

column, the $$\left(\frac{1}{2}\cdot\frac{N}{s}+2\right)$$

and so on to the $$\frac{N}{s}th$$

columns, corresponds to a Q (quadrature) component. For example, the first column and the $$\left(\frac{1}{2}\cdot\frac{N}{s}+1\right)th$$

column of the block 200 are mapped to a constellation symbol, wherein the first column specifies the I component and the $$\left(\frac{1}{2}\cdot\frac{N}{s}+1\right)th$$

column specifies the Q component.

The columns are mapped to constellation symbols in such a way that the top rows of the block 200 correspond to more significant bits (MSBs) and the lower rows of the block 200 correspond to less significant bits (LSBs) of the I-components and Q-components. For example, in case of 16QAM, the first column holds the more significant bit of the I-component in the first row and the less significant bit of the I-component in the second row.

The codeword $\underline{c}$ is written to the block 200 in the row direction. This means that the first bit of the codeword $\underline{c}$ corresponds to the bit in the first row of the first column of the block 200, the second bit of the codeword $\underline{c}$ corresponds to the bit in the first row of the second column, . . . , the N/s+1 bit of the codeword $\underline{c}$ corresponds to the bit in the second row of the first column and so on.

Assuming that bits input to the M-ary modulator 104 are by default written to the block 200 in column direction, i.e. the first $$\frac{\log_2 M}{2}$$

are written, from top to bottom, into the first column, the second $$\frac{\log_2 M}{2}$$

are written, from top to bottom, into the second column and so on, the writing of codeword $\underline{c}$ in row direction (instead of column direction) corresponds to a permutation of the codeword $\underline{c}$ to a codeword $\underline{\tilde{c}}$ given by $$\underline{\tilde{c}} = \underline{u}\underline{\tilde{G}} \qquad (7)$$

where the modified generator matrix $\underline{\tilde{G}}$ is given by $$\underline{\tilde{G}} = \underline{G}\underline{P}. \qquad (8)$$

The matrix $\underline{P} = [p_{i,j}]$ is a permutation matrix according to the permutation of the codeword $\underline{c}$. It is given by $$p_{i,j} = \begin{cases} 1, & i = \theta \text{ and } j = \mu \\ 0, & \text{otherwise} \end{cases} \qquad (9)$$

where $\theta = 0, 1, \ldots, N-1$ and $\mu = N/s \times (\theta \bmod s) + \text{floor}(\theta/s)$, $\theta = 0, 1, \ldots, N-1$.

This means that the codeword $\underline{\tilde{c}}$ is written to the block 200 in column direction, which is equivalent to writing the codeword $\underline{c}$ in row direction.

This means that in LDPC code, the permutation of codeword $\underline{c}$ is equivalent to modifying the generator matrix G to $\underline{\tilde{G}} = \underline{G}\underline{P}$, where $\underline{P}$ is the permutation matrix. The corresponding parity-check matrix is $\underline{\tilde{H}} = \underline{H}\underline{P}^T$. $\underline{\tilde{G}}$ and $\underline{\tilde{H}}$ may be pre-designed and stored in transmitter and receiver, respectively. Therefore, the permutation design, or equivalently the optimization of matrix $\underline{P}$; does not introduce any latency and does not increase processing complexity.

The systematic bits of the codeword $\underline{c}$ are written to MSBs and are thus highly protected. This leads to a high performance.

In order to verify that the above UEP (unequal error protection) permutation scheme leads to a high performance its performance is compared with the performance of the two prior art methods for LDPC encoded modulation described above (Method 1: using bit interleaver according to IEEE 802.11a; Method 2: direct mapping of LDPC codeword to M-ary symbol) with 16QAM and 64QAM over independent Rayleigh fading channel.

An efficiently encodable irregular LDPC code of practical interest, the partial-differential (PD) LDPC code, is applied for simulation. The Rate-1/2 PD-LDPC (2304, 1152) is used. In this case $\underline{H}_2$ is a low-dual-diagonal matrix and $\underline{H}_1$ has column weight of 6 and is designed by the progressive edge-growth (PEG) method.

The constellation of 16QAM and 64QAM with Gray mapping follows IEEE 802.11a (see [3]). At the receiver, the bit metric generated based on maximum likelihood criterion is passed into iterative LDPC decoder applying the sum-product message-passing algorithm. The maximum number of iterations is set as 40. The results are shown in FIG. 3.

Figure 3:
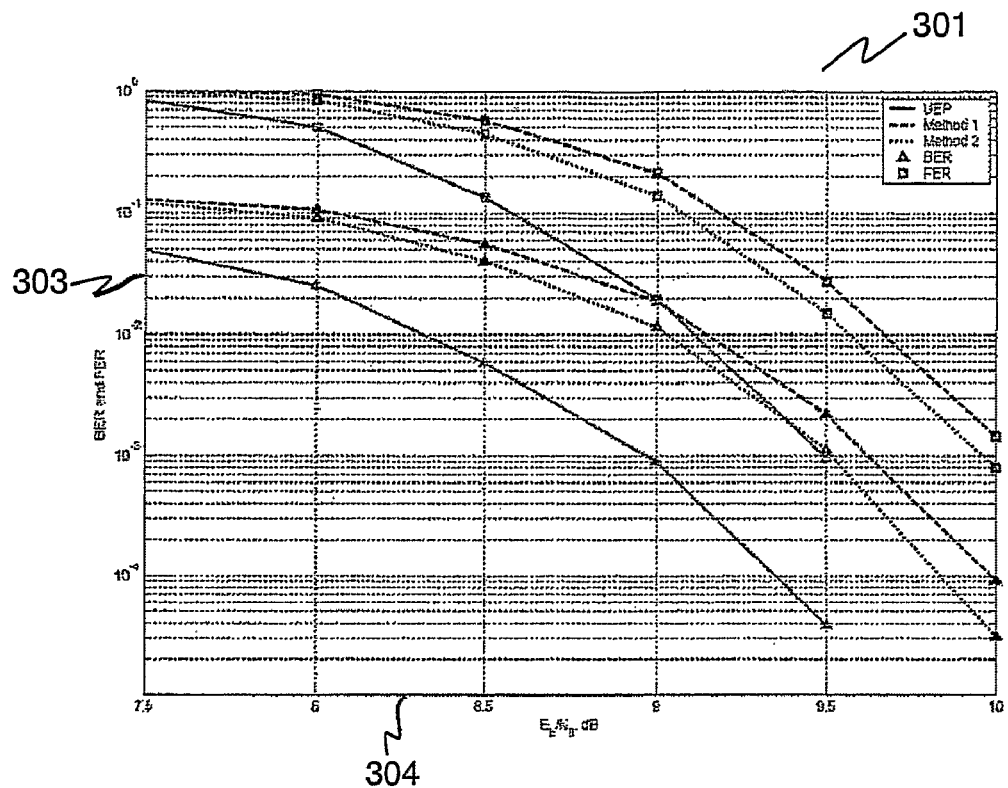
FIG. 3 shows diagrams illustrating the performance of an embodiment of the invention.
Figure 3:
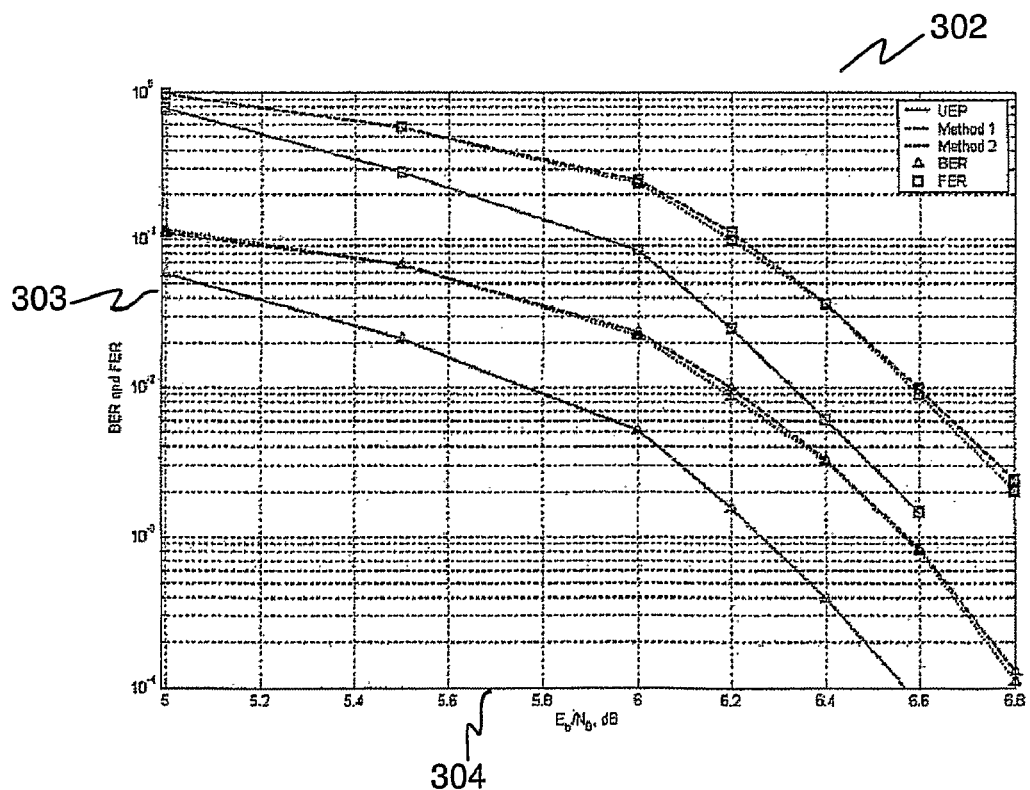

FIG. 3 shows diagrams illustrating the performance of an embodiment of the invention.

A first diagram 301 shows the bit-error-rate (BER) and frame-error-rate (FER) performance for 64QAM. A second diagram 302 shows the bit-error-rate (BER) and frame-error-rate (FER) performance for 16QAM.

In the diagrams 301, 302, the BER and the FER grow from bottom to top, i.e. in the direction of the respective y-axis 303. The ratio of coderate to codeword size grows from left to right, i.e. in the direction of the respective x-axis 304 and is given in dB.

The performance gain achieved by the proposed permutation over the two prior art methods can be seen from the summary in table 1 for 16QAM and 64QAM. Method 1 and Method 2 have similar performance in 16QAM and Method 2 outperforms Method 1 in 64QAM.

TABLE 1

| Gain in dB | | 16QAM | 64QAM |
|---|---|---|---|
| UEP vs Method 1 | BER@$10^{-4}$ | 0.24 | 0.62 |
| | FER@$10^{-2}$ | 0.26 | 0.45 |
| UEP vs Method 2 | BER@$10^{-4}$ | 0.24 | 0.48 |
| | FER@$10^{-2}$ | 0.26 | 0.57 |

Further, a comparison of the performance of the proposed permutation compared with Method 2 is given for a 2×2 spatial multiplexing (SM) MIMO-OFDM (multiple input multiple output orthogonal frequency division multiplexing) system which is designed for a HT WLAN (high throughput wireless local area network) system. The proposed permutation is only compared with Method 2 because of the above observation that Method 2 outperforms Method 1 in 64QAM over Rayleigh fading channel.

A practical IEEE 802.11n channel model is used for examination and the receiver considers practical frequency offset estimation, phase compensation, and channel estimation (including SNR estimation). The simulation parameters are given in table 2 and the results are shown in FIG. 4.

TABLE 2

| | |
|---|---|
| LDPC code | Rate-½ PD-LDPC(2304, 1152) with column weight {6, 2, 1}; Single encoder for multiple spatial streams. |
| Modulation | 64QAM with Gray mapping |
| OFDM size | 128 |
| Number of data sub-carriers | 96 |
| Number of spatial streams | 2 |
| Multiple antennas | Tx: 2 Rx: 2 |
| IEEE 802.11n channel model | Channel B, Channel E |
| Packet size | 1012 bytes |

Figure 4:
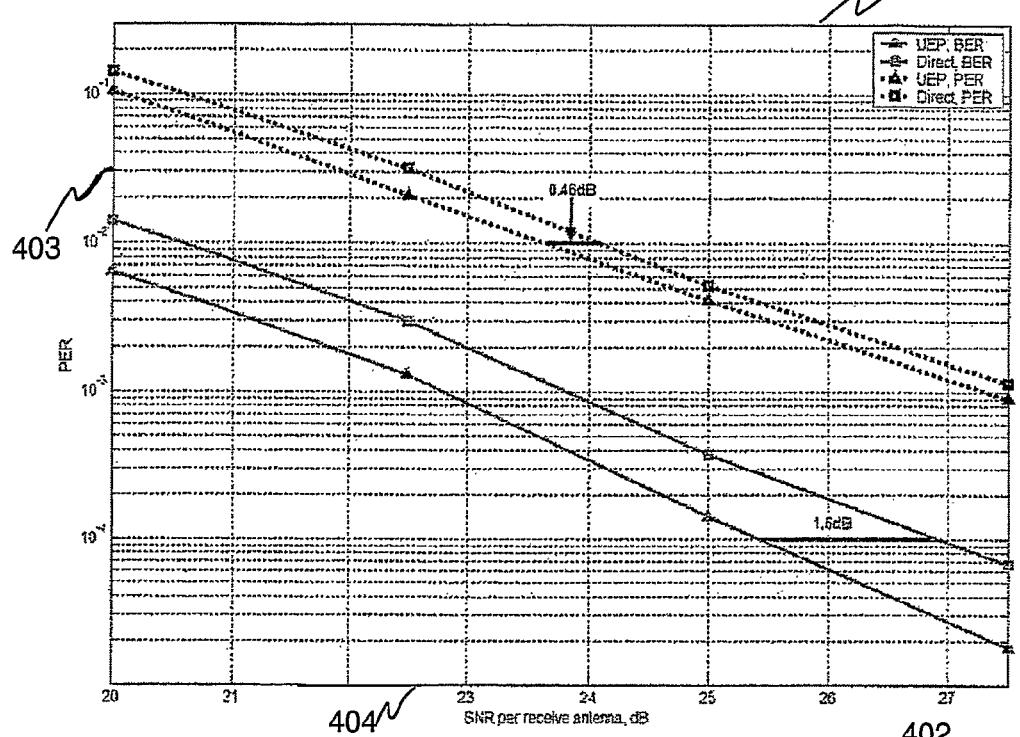
FIG. 4 shows diagrams illustrating the performance of an embodiment of the invention.
Figure 4:
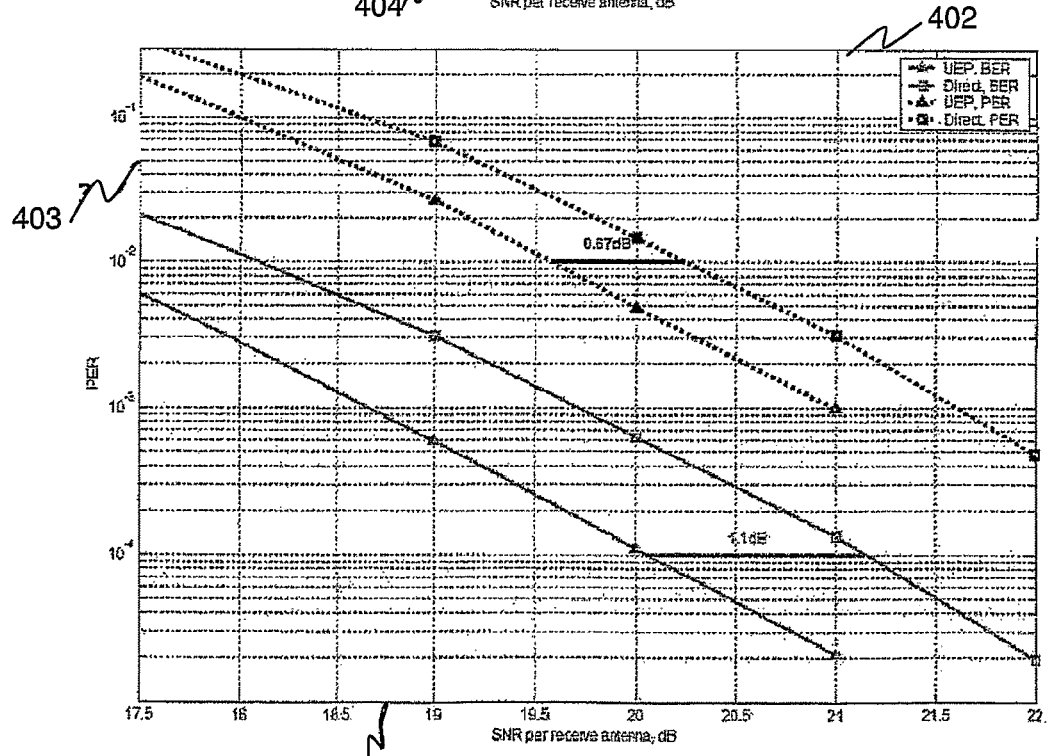

FIG. 4 shows diagrams illustrating the performance of an embodiment of the invention.

A first diagram 401 shows the bit-error-rate (BER) and frame-error-rate (FER) performance for Channel B. A second diagram 402 shows the bit-error-rate (BER) and frame-error-rate (FER) performance for Channel E.

Similar to above, in the diagrams 401, 402, the BER and the FER grow from bottom to top, i.e. in the direction of the respective y-axis 403. The ratio of coderate to codeword size grows from left to right, i.e. in the direction of the respective x-axis 404 and is given in dB.

The BER gain of the proposed permutation over Method 2 is 1.5 dB and 1.1 dB at BER=$10^{-4}$ for Channel B and Channel E, respectively, and the PER gain is 0.46 dB and 0.67 dB at PER=$10^{-2}$ for Channel B and Channel E, respectively.

Simulations further show that PER performance gains of the proposed UEP mapping over direct mapping (Method 2) increase with column weights of LDPC. However, higher column weight does not always lead to better PER performance. There is a trade-off lying here. Increasing column weight leads to larger free distance. On the other hand, it also increases the possibility and number of short girth.

By simulations, it can also be seen that different assignment of a LDPC codeword into channels with unequal SNR results in non-identical performance. In case of two channels with different SNR, for example, it is beneficial that systematic bits are highly protected, i.e., to assign all systematic bits into the channel with higher SNR and all parity bits into the channel with lower SNR.

In this document, the following publications are cited:

[1] R. G. Gallager, *Low-Density Parity-Check Codes*. Cambridge, Mass.: MIT Press, 1963
[2] J. Hou, P. H. Siegel, L. B. Milstein, and H. D. Pfister, "Capacity-approaching bandwidth-efficient coded modulation schemes based on low-density parity-check codes," *IEEE Trans. Inform. Theory*, vol. 49, no. 9, pp. 2141-2155, September 2003.
[3] *IEEE 802.11a wireless LAN medium access control and physical layer specifications: high-speed physical layer in the 5 GHz band*. IEEE std 802.11a-1999, September 1999
[4] A. H. S. Mohammadi, A. K. Khandani, "On unequal error protection on turbo-encoder output bits," *Electronics Lett.*, vol. 33, no. 4, pp. 273-274, February 1997
[5] V. Kumar, O. Milenkovic, "On unequal error protection LDPC codes based on Plotkin-type Construction", *IEEE GlobeCom* 2004, Dallas, Tex., November 2004
[6] X. Tang, M.-S. Alouini, A. J. Goldsmith, "Effect of channel estimation error on M-QAM BER performance in Rayleigh fading", *IEEE Trans. Commun.*, vol. 47, no. 12, pp. 1856-1864, December 1999

The invention claimed is:

1. A Method for transmitting data comprising a plurality of data bits, the method comprising the steps:
   the data is mapped to a plurality of modulation symbols, each modulation symbol comprising at least one more significant bit and at least one less significant bit;
   at least one parity bit is generated for the plurality of data bits;
   a codeword is generated, wherein the codeword comprising the plurality of data bits and the at least one parity bit generated;
   the plurality of data bits are mapped to more significant bits of the plurality of modulation symbols and the at least one parity bit is mapped to at least one less significant bit of the plurality of modulation symbols,
   wherein the codeword is arranged in the form of a block of bits, the block of bits comprises at least two rows of bits, and the codeword is written to the block of bits in the row direction; and
   the codeword $\underline{\tilde{c}}$ is generated according to $\underline{\tilde{c}} = u\tilde{G}$, where u is the vector of the plurality of data bits, $\tilde{G}$ is a modified generator matrix given by $\tilde{G} = GP$, wherein G is a generator matrix, $P=[p_{i,j}]$ is a permutation matrix, and is given by $$p_{i,j} = \begin{cases} 1, & i = \theta \text{ and } j = \mu \\ 0, & \text{otherwise} \end{cases},$$

where $p_{i,j}$ is the element of the permutation matrix in the ith row and the jth column, $\theta=0, 1, \ldots, N-1$ and $\mu=N/s\times(\theta \mod s)+\text{floor}(\theta/s)$, $\theta=0, 1, \ldots, N-1$, wherein the codeword $\underline{\tilde{c}}$ is of length N, and the block comprises s rows.

2. The Method according to claim 1, wherein the plurality of modulation symbols are sent using at least one communication channel.

3. The Method according to claim 1, further comprising modulating at least one carrier signal according to the plurality of modulation symbols.

4. The Method according to claim 1, wherein the data is mapped to the plurality of modulation symbols according to a quadrature amplitude modulation.

5. A Transmitter for transmitting data, the data comprising a plurality of data bits, the transmitter comprises:
   a mapping unit adapted to map the data mapped to a plurality of modulation symbols, each modulation symbol comprising at least one more significant bit and at least one less significant bit;
   a first generation unit adapted to generate at least one parity bit generated for the plurality of data bits and to generate a codeword comprising the plurality of data bits and the at least one parity bit generated;
   the mapping unit is adapted to map the plurality of data bits to more significant bits of the plurality of modulation symbols and to map the at least one parity bit to at least one less significant bit of the plurality of modulation symbols, wherein
   the codeword is arranged in the form of a block of bits, the block of bits comprises at least two rows of bits, and the codeword is written to the block of bits in the row direction; and
   the codeword $\underline{\tilde{c}}$ is generated according to $\underline{\tilde{c}} = u\tilde{G}$, where u is the vector of the plurality of data bits, $\tilde{G}$ is a modified generator matrix given by $\tilde{G} = GP$, wherein G is a generator matrix, $P=[p_{i,j}]$ is a permutation matrix, and is given by $$p_{i,j} = \begin{cases} 1, & i = \theta \text{ and } j = \mu \\ 0, & \text{otherwise} \end{cases},$$

where $p_{i,j}$ is the element of the permutation matrix in the ith row and the jth column, $\theta=0, 1, \ldots, N-1$ and $\mu=N/s\times(\theta \mod s)+\text{floor}(\theta/s)$, $\theta=0, 1, \ldots, N-1$, wherein the codeword $\underline{\tilde{c}}$ is of length N, and the block comprises s rows.

6. A Method for receiving data comprising a plurality of data bits wherein the method comprises the steps:
   a plurality of modulation symbols are received, each modulation symbol comprising at least one more significant bit and at least one less significant bit;
   at least one parity bit for the plurality of data bits is extracted from at least one less significant bit of the plurality of modulation symbols;
   the plurality of data bits are extracted from the plurality of modulation symbols;
   a codeword is generated, wherein the codeword comprising the plurality of data bits and the at least one parity bit extracted, and wherein
   the codeword is arranged in the form of a block of bits, the block of bits comprises at least two rows of bits, and the codeword is subsequently read from the block of bits in the row direction; and
   the codeword $\underline{\tilde{c}}$ is generated according to $\underline{\tilde{c}} = u\tilde{G}$, where u is the vector of the plurality of data bits, $\tilde{G}$ is a modified generator matrix given by $\tilde{G} = GP$, wherein G is a generator matrix, $P=[p_{i,j}]$ is a permutation matrix, and is given by $$p_{i,j} = \begin{cases} 1, & i = \theta \text{ and } j = \mu \\ 0, & \text{otherwise} \end{cases},$$

where $p_{i,j}$ is the element of the permutation matrix in the ith row and the jth column, $\theta=0, 1, \ldots, N-1$ and $\mu=N/s\times(\theta \mod s)+\text{floor}(\theta/s)$, $\theta=0, 1, \ldots, N-1$, wherein the codeword $\underline{\tilde{c}}$ is of length N, and the block comprises s rows.

7. A Receiver for receiving data, the data comprising a plurality of data bits, wherein the receiver comprises:

- a receiving unit adapted to receive a plurality of modulation symbols, each modulation symbol comprising at least one more significant bit and at least one less significant bit;
- a first extraction unit adapted to extract at least one parity bit for the plurality of data bits from at least one less significant bit of the plurality of modulation symbols;
- a second extraction unit adapted to extract the plurality of data bits from the plurality of modulation symbols;
- a generator unit adapted to generate a codeword, wherein the codeword comprising the plurality of data bits and the at least one parity bit extracted, and wherein
- the codeword is arranged in the form of a block of bits, the block of bits comprises at least two rows of bits, and the codeword is subsequently read from the block of bits in the row direction; and
- the codeword $\underline{\tilde{c}}$ is generated according to $\underline{\tilde{c}}=\underline{u}\tilde{G}$, where u is the vector of the plurality of data bits, $\underline{\tilde{G}}$ is a modified generator matrix given by $\underline{\tilde{G}}=\underline{GP}$, wherein G is a generator matrix, $P=[p_{i,j}]$ is a permutation matrix, and is given by $$p_{i,j} = \begin{cases} 1, & i = \theta \text{ and } j = \mu \\ 0, & \text{otherwise} \end{cases},$$

where $p_{i,j}$ is the element of the permutation matrix in the ith row and the jth column, $\theta=0, 1, \ldots, N-1$ and $\mu=N/s\times(\theta \mod s)+\text{floor}(\theta/s)$, $\theta=0, 1, \ldots, N-1$, wherein the codeword $\underline{\tilde{c}}$ is of length N, and the block comprises s rows.

\* \* \* \* \*